US010078995B2

(12) United States Patent
Kim et al.

(10) Patent No.: US 10,078,995 B2
(45) Date of Patent: Sep. 18, 2018

(54) GATE DRIVER AND DISPLAY DEVICE INCLUDING THE SAME

(71) Applicant: SAMSUNG DISPLAY CO., LTD., Yongin-si, Gyeonggi-do (KR)

(72) Inventors: Jong Hee Kim, Yongin-si (KR); Ji Sun Kim, Yongin-si (KR); Young Wan Seo, Yongin-si (KR); Jae Keun Lim, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 179 days.

(21) Appl. No.: 15/084,022

(22) Filed: Mar. 29, 2016

(65) Prior Publication Data

US 2016/0293131 A1 Oct. 6, 2016

(30) Foreign Application Priority Data

Apr. 2, 2015 (KR) ........................ 10-2015-0046683

(51) Int. Cl.

*G09G 5/00* (2006.01)
*H03K 17/687* (2006.01)
*G09G 3/3266* (2016.01)
*G09G 3/36* (2006.01)

(52) U.S. Cl.

CPC ............. *G09G 5/00* (2013.01); *G09G 3/3266* (2013.01); *G09G 3/3674* (2013.01); *G09G 2310/0267* (2013.01); *G09G 2310/0286* (2013.01); *G09G 2310/061* (2013.01); *G09G 2310/08* (2013.01)

(58) Field of Classification Search

None
See application file for complete search history.

(56) References Cited

U.S. PATENT DOCUMENTS

| | | | | |
|---|---|---|---|---|
| 9,626,895 | B2 * | 4/2017 | Tsai | G09G 3/2092 |
| 2007/0290982 | A1 | 12/2007 | Kim et al. | |
| 2008/0273004 | A1 * | 11/2008 | Osame | G09G 3/3266 345/100 |
| 2013/0335392 | A1 | 12/2013 | Cho et al. | |

(Continued)

FOREIGN PATENT DOCUMENTS

| | | |
|---|---|---|
| KR | 10-2007-0119346 A | 12/2007 |
| KR | 10-2011-0123459 A | 11/2011 |

(Continued)

*Primary Examiner* — Joseph Haley
*Assistant Examiner* — Emily Frank
(74) *Attorney, Agent, or Firm* — Lewis Roca Rothgerber Christie LLP

(57) ABSTRACT

A gate driver includes a plurality of stage circuits to output a clock signal from the outside as gate signals. A jth stage circuit includes an input unit to charge a first node at an initial voltage when a first input signal is input to a first input terminal, a buffer unit to output the clock signal as a gate signal to an output terminal when the initial voltage is supplied to the first node, a holding unit to maintain the first node at a reset power source level when the clock signal is supplied to the holding unit, and an inverter unit to supply the clock signal or the reset power source to the holding unit. The input unit maintains the first node at a second input signal input voltage to a second input terminal when a third input signal is input to a third input terminal.

20 Claims, 5 Drawing Sheets

(56) References Cited

U.S. PATENT DOCUMENTS

| | | | | |
|---|---|---|---|---|
| 2014/0092082 | A1* | 4/2014 | Choi | G09G 3/3696 345/213 |
| 2015/0042383 | A1 | 2/2015 | Kwon et al. | |
| 2015/0161958 | A1* | 6/2015 | Hsu | G09G 3/3674 345/99 |
| 2015/0358018 | A1 | 12/2015 | Kim et al. | |

FOREIGN PATENT DOCUMENTS

| | | | |
|---|---|---|---|
| KR | 10-2013-0142454 | A | 12/2013 |
| KR | 10-2014-0042983 | A | 4/2014 |
| KR | 10-2015-0142708 | | 12/2015 |

* cited by examiner

GATE DRIVER AND DISPLAY DEVICE INCLUDING THE SAME

CROSS-REFERENCE TO RELATED APPLICATION

This application claims priority to and the benefit of Korean Patent Application No. 10-2015-0046683, filed on Apr. 2, 2015, in the Korean Intellectual Property Office, the entire contents of which are incorporated herein by reference in their entirety.

BACKGROUND

1. Field

An aspect of embodiments of the present invention relates to a gate driver, and more particularly, to a gate driver capable of stably generating gate signals and securing an integrated area and a display device including the same.

2. Description of the Related Art

With the development of information technology (IT), importance of a display device that is a connection medium between a user and information is spotlighted. Therefore, use of a display device such as a liquid crystal display device (LCD), an organic light emitting display device (OLED), and a plasma display panel (PDP) is increasing.

In general, the display device includes a data driver for supplying data signals to data lines, a gate driver for supplying gate signals to gate lines, and a pixel unit including pixels positioned in crossing regions of the gate lines and the data lines.

The gate driver includes stage circuits connected to the gate lines. The stage circuits supply the gate signals to the gate lines in response to signals received from a timing controller.

A stage circuit generally includes a transistor having a size (e.g., at least a predetermined size) in order to stably generate a gate signal. In addition, the gate driver generally includes additional transistors in order to stably supply the gate signals to the pixels.

Therefore, in the display panel, it may be difficult to secure a space and to implement a display device that requires small and integrated parts.

SUMMARY

An embodiment of the present invention relates to a gate driver capable of stably generating signals without increasing the sizes of transistors or adding a new (or additional) transistor and a display device including the same.

A gate driver according to an embodiment of the present invention includes a plurality of stage circuits configured to output a clock signal input from the outside as gate signals. A jth (j is a natural number greater than 2) stage circuit of the stage circuits includes an input unit configured to charge a first node at a level of an initial voltage when a first input signal is input to a first input terminal, a buffer unit configured to output the clock signal as a gate signal to an output terminal when the initial voltage is supplied to the first node, a holding unit configured to maintain the first node at a level of a reset power source when the clock signal is supplied to the holding unit, and an inverter unit configured to supply the clock signal or the reset power source to the holding unit when the clock signal or the reset power source is supplied to the inverter unit. The input unit is configured to maintain the first node at a voltage level of a second input signal input to a second input terminal when a third input signal is input to a third input terminal.

The input unit may include a second transistor having a first electrode and a gate electrode connected to a first input terminal and a second electrode connected to the first node and a third transistor having a first electrode connected to the second input terminal, a second electrode connected to the first node, and a gate electrode connected to the third input terminal.

The buffer unit may include a first transistor having a first electrode connected to a clock signal input terminal, a second electrode connected to the output terminal, and a gate electrode connected to the first node.

The holding unit may include a fourth transistor having a first electrode connected to the first node, a second electrode connected to the reset power source, and a gate electrode connected to a second node and a fifth transistor having a first electrode connected to the output terminal, a second electrode connected to the reset power source, and a gate electrode connected to the second node.

The jth stage circuit may further include a discharging unit configured to discharge the output terminal at the level of the reset power source in response to the third input signal.

The discharging unit may include a sixth transistor having a first electrode connected to the output terminal, a second electrode connected to the reset power source, and a gate electrode connected to the third input terminal.

The inverter unit may include a seventh transistor having a first electrode and a gate electrode connected to a clock signal input terminal and a second electrode connected to a second node and an eighth transistor having a first electrode and a gate electrode connected to the reset power source and a second electrode connected to the second node.

The first input signal may be a carry signal output from a (j−2)th stage circuit.

The second input signal may be a gate signal output from a (j+1)th stage circuit and the third input signal is a gate signal output from a (j+2)th stage circuit.

A gate on voltage period of the second input signal may partially overlap a gate on voltage period of the third input signal.

The gate driver may be formed in a peripheral area of a display panel having a display area and the peripheral area.

The gate driver may further include a ninth transistor connected to a jth gate line and configured to compensate for delay of the gate signal generated by the jth gate line. The ninth transistor is provided on one side of the display panel, wherein the jth stage circuit is formed on the other side of the display panel and the output terminal is connected to the jth gate line.

The jth stage circuit may be formed on one side of the display panel and a (j+1)th stage circuit is formed on the other side of the display panel.

A display device according to another embodiment of the present invention includes a display panel including a plurality of pixels and a gate driver including a plurality of stage circuits configured to output a clock signal input from the outside as gate signals. A jth (j is a natural number greater than 2) stage circuit of the stage circuits includes an input unit configured to charge a first node at a level of an initial voltage when a first input signal is input to a first input terminal, a buffer unit configured to output the clock signal as a gate signal to an output terminal when the initial voltage is supplied to the first node, a holding unit configured to maintain the first node at a level of a reset power source when the clock signal is supplied to the holding unit, and an inverter unit configured to supply the clock signal or the reset power source to the holding unit when the clock signal or the reset power source is supplied to the inverter unit. The input unit is configured to maintain the first node at a voltage level of a second input signal input to a second input terminal when a third input signal is input to a third input terminal.

The gate driver may be configured to output the gate signals to a plurality of pixels by an interlaced method in which the gate driver is arranged on each of a first side and a second side of the display panel.

The input unit may include a second transistor having a first electrode and a gate electrode connected to a clock signal input terminal and a second electrode connected to the first node and a third transistor having a first electrode connected to the second input terminal, a second electrode connected to the first node, and a gate electrode connected to the third input terminal.

The buffer unit may include a first transistor having a first electrode connected to a first input terminal, a second electrode connected to the output terminal, and a gate electrode connected to the first node.

The holding unit may include a fourth transistor having a first electrode connected to the first node, a second electrode connected to the reset power source, and a gate electrode connected to a second node and a fifth transistor having a first electrode connected to the output terminal, a second electrode connected to the reset power source, and a gate electrode connected to the second node.

The inverter unit may include a seventh transistor having a first electrode and a gate electrode connected to a clock signal input terminal and a second electrode connected to a second node and an eighth transistor having a first electrode and a gate electrode connected to the reset power source and a second electrode connected to the second node.

The second input signal may be a gate signal output from a (j+1)th stage circuit, the third input signal may be a gate signal output from a (j+2)th stage circuit, and a gate on voltage period of the second input signal may partially overlap a gate on voltage period of the third input signal.

The gate driver according to the embodiment of the present invention may control a gate signal of a current stage circuit by using gate signals output from other stage circuits. Therefore, the gate driver may not include an additional transistor for controlling the gate signal of the current stage circuit.

In addition, the gate driver according to the embodiment of the present invention may uniformly maintain a voltage level of a first node of the current stage circuit by using the gate signals output from the other stage circuits. Therefore, the gate driver may stably generate gate signals without increasing sizes of transistors included in stage circuits.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Aspects of embodiments of the present invention will now be described more fully with reference to the accompanying drawings, in which exemplary embodiments shown. The aspects of embodiments of the present invention may, however, be embodied in many different forms and should not be construed as limited to the exemplary embodiments set forth herein. Rather, these embodiments are provided so that this disclosure will be thorough and complete, and will fully convey the scope of the aspects of embodiments of the present invention to one of ordinary skill in the art.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope of the inventive concept.

It will also be understood that when an element is referred to as being "connected to" another element, it can be directly connected to the other element, or intervening elements may also be present. On the other hand, when an element is referred to as being "directly connected to" another element, it can be understood that intervening elements do not exist. Other expressions describing a relationship between elements, for example, "between" and "directly between" may be interpreted as described above.

Unless otherwise defined, terms such as "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Unless otherwise defined, all terms (including technical and scientific terms) used herein have the same meaning as commonly understood by one of ordinary skill in the art to which embodiments of the present invention belong.

Hereinafter, embodiments of the present invention will be described in more detail with reference to the accompanying drawings.

Figure 1:
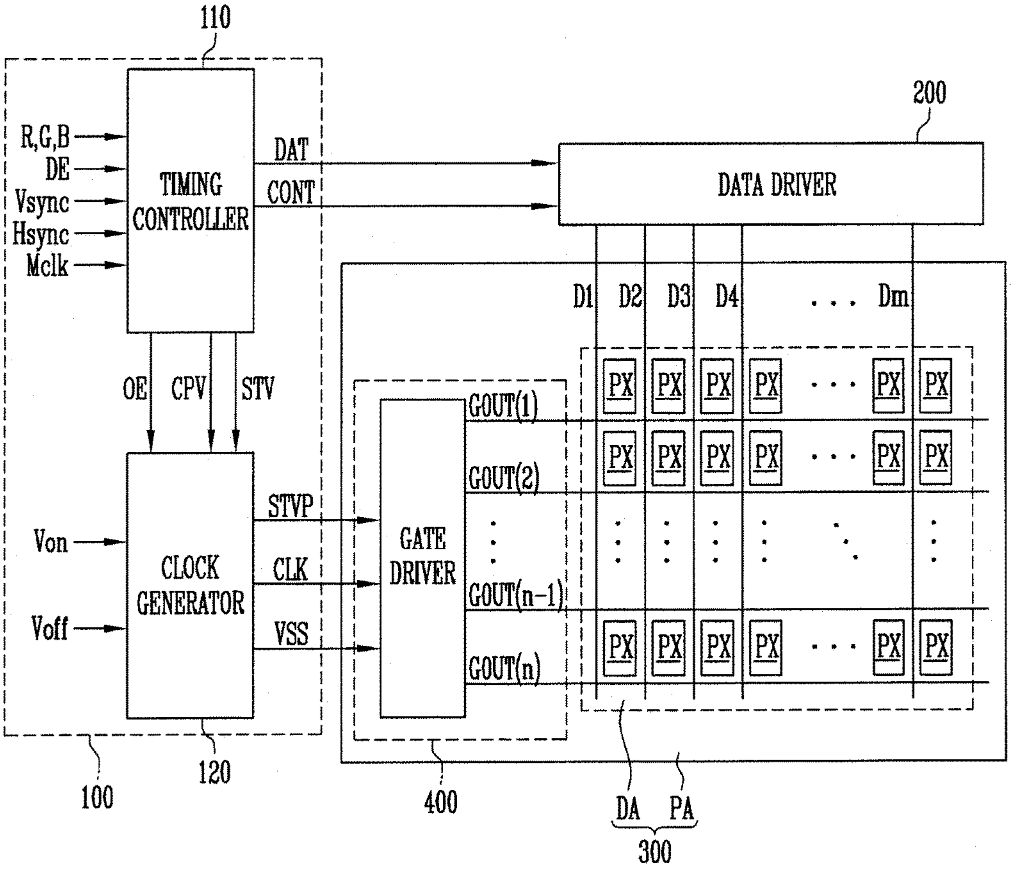
FIG. 1 is a block diagram of a display device according to an embodiment of the present invention.

FIG. 1 is a block diagram of a display device according to an embodiment of the present invention.

Referring to FIG. 1, the display device according to the embodiment of the present invention includes a signal providing unit 100, a data driver 200, and a display panel 300.

For example, the display device may be implemented by a liquid crystal display device (LCD), an organic light emitting display device (OLED), and a plasma display panel (PDP). However, embodiments of the present invention are not limited thereto.

The signal providing unit 100 may include a timing controller 110 and a clock generator 120.

The timing controller 110 may generate an image signal DAT, a data control signal CONT, clock generation control signals OE and CPV, and a first scan start signal STV by using input image signals R, G, and B and input control signals DE, Hsync, Vsync, and Mclk supplied (or input) from the outside.

The timing controller 110 may provide the generated image signal DAT and data control signal CONT to the data driver 200. Here, the data control signal CONT may control an operation of the data driver 200.

For example, the data control signal CONT may include a horizontal start signal for starting the operation of the data driver 200 and a load signal for indicating two data voltages to be output.

The clock generator 120 may receive a gate on voltage Von and a gate off voltage Voff from the outside.

The clock generator 120 may generate a scan start signal STVP by using the first scan start signal STV, may generate the clock signal CLK by using the clock generation control signals OE and CPV, and may generate a reset power source VSS by using the gate on voltage Von and the gate off voltage Voff.

The clock generator 120 may provide the scan start signal STVP, the clock signal CLK, and the reset power source VSS to a gate driver 400.

The data driver 200 may generate a data voltage including an image data signal of (or having) a uniform unit. The data driver 200 may provide an image data voltage corresponding to the image signal DAT to each of data lines in accordance with the data control signal CONT.

The display panel 300 may include (or be divided into) a display area DA in which an image is displayed and a peripheral area (or a non-display area) PA in which an image is not displayed.

The display area DA includes pixels PX connected to gate lines and the data lines. The pixels PX may respectively receive gate signals GOUT(1), GOUT(2), GOUT(n−1), and GOUT(n) and data signals D1, D2, D3, D4, . . . , and Dm through the gate lines and the data lines, respectively. When the pixels PX respectively receive the gate signals GOUT(1), GOUT(2), GOUT(n−1), and GOUT(n) from the gate driver 400, the pixels PX may respectively receive the data signals D1, D2, D3, D4, . . . , and Dm from the data driver 200 and emit light components with brightness components corresponding to the data signals D1, D2, D3, D4, . . . , and Dm.

The non-display area PA may be positioned outside the display area DA and, unlike the display area DA, does not display an image.

The gate driver 400 may output the clock signal CLK as the gate signals GOUT(1), GOUT(2), . . . , GOUT(n−1), and GOUT(n) to the pixels PX in response to the scan start signal STVP.

Figure 2:
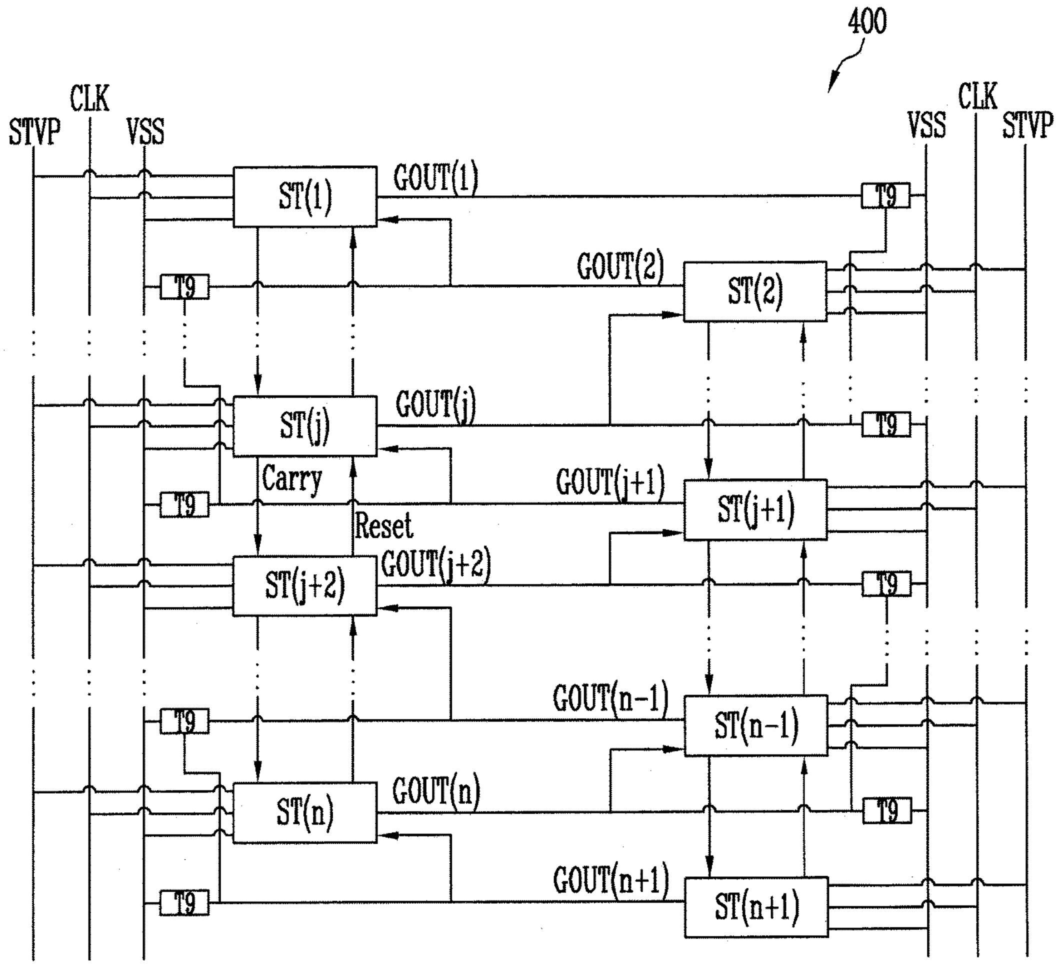
FIG. 2 is a view schematically illustrating a gate driver according to an embodiment of the present invention.

FIG. 2 is a view schematically illustrating a gate driver according to an embodiment of the present invention.

Referring to FIGS. 1 and 2, the gate driver 400 will be specifically described. The gate driver 400 may include a plurality of stage circuits ST(1) to ST(n+1). The stage circuits ST(1) to ST(n+1) are respectively connected to the gate lines and may output the gate signals GOUT(1) to GOUT(n+1).

The stage circuits ST(1) to ST(n+1) may receive the scan start signal STVP, the gate off voltage Voff, and the clock signal CLK from the clock generator 120. Here, the scan start signal STVP may be an initializing signal for generating the gate signals of the stage circuits.

According to the embodiment, the first stage circuit ST(1) may use the scan start signal STVP as an initializing signal and the remaining stage circuits ST(2) to ST(n+1) may use carry signals Carry received from previous stage circuits as initializing signals.

For example, a jth stage circuit ST(j) connected to a jth (j≈1) gate line may receive a carry signal from a previous stage circuit ST(j−2) and may perform initialization for generating a gate signal GOUT(j) by using the received carry signal.

The stage circuits ST(1) to ST(n+1) may output the clock signal CLK as the gate signals by using the scan start signal STVP or the carry signals Carry received from previous stage circuits.

For example, the jth stage circuit ST(j) performs initialization by using the carry signal received from the previous stage circuit ST(j−2) and may output the received clock signal CLK to a gate line as the gate signal GOUT(j).

The stage circuits ST(1) to ST(n+1) may control gate on voltage periods by using the reset power source VSS.

The stage circuits ST(1) to ST(n+1) may receive a gate signal from a next stage circuit for correct gate on voltage periods. The stage circuits ST(1) to ST(n+1) may transition the gate on voltages to the gate off voltages without delay by using the gate signal received from the next stage circuit.

Here, a gate on voltage period of the gate signal received from the next stage circuit partially overlaps a gate on voltage period of a gate signal output from a current stage circuit.

For example, the jth stage circuit ST(j) may receive a gate signal GOUT(j+1) from a (j+1)th stage circuit ST(j+1) and may control a gate on voltage period of a gate signal GOUT(j) by using the gate signal GOUT(j+1). Here, the gate on voltage period of the gate signal GOUT(j) overlaps a gate on voltage period of the gate signal GOUT(j+1).

In one embodiment, the gate driver 400 is arranged on both a first side (e.g., a left side) of the display panel and a second side (e.g., a right side) of the display panel, the second side being opposite the first side. For example, as shown in FIG. 2, the jth stage circuit ST(j) of the gate driver 400 may be located on the first (e.g., left) side of the display panel and the (j+1)th stage circuit ST(j+1) may be located on the second (e.g., right) side of the display panel.

According to the embodiment, on the other side of gate lines connected to the stage circuits ST(1) to ST(n+1), the gate driver 400 may include a transistor T9 for compensating for delay of gate signals generated by the gate lines. For example, as seen in FIG. 2, the jth stage circuit ST(j) on the first (e.g., left) side of the display panel is coupled to a transistor T9 on the second (e.g., right) side of the display panel. Similarly, the (j+1)th stage circuit ST(j+1) on the second (e.g., right) side of the display panel is coupled to a transistor T9 on the first (e.g., left) side of the display panel.

Figure 3:
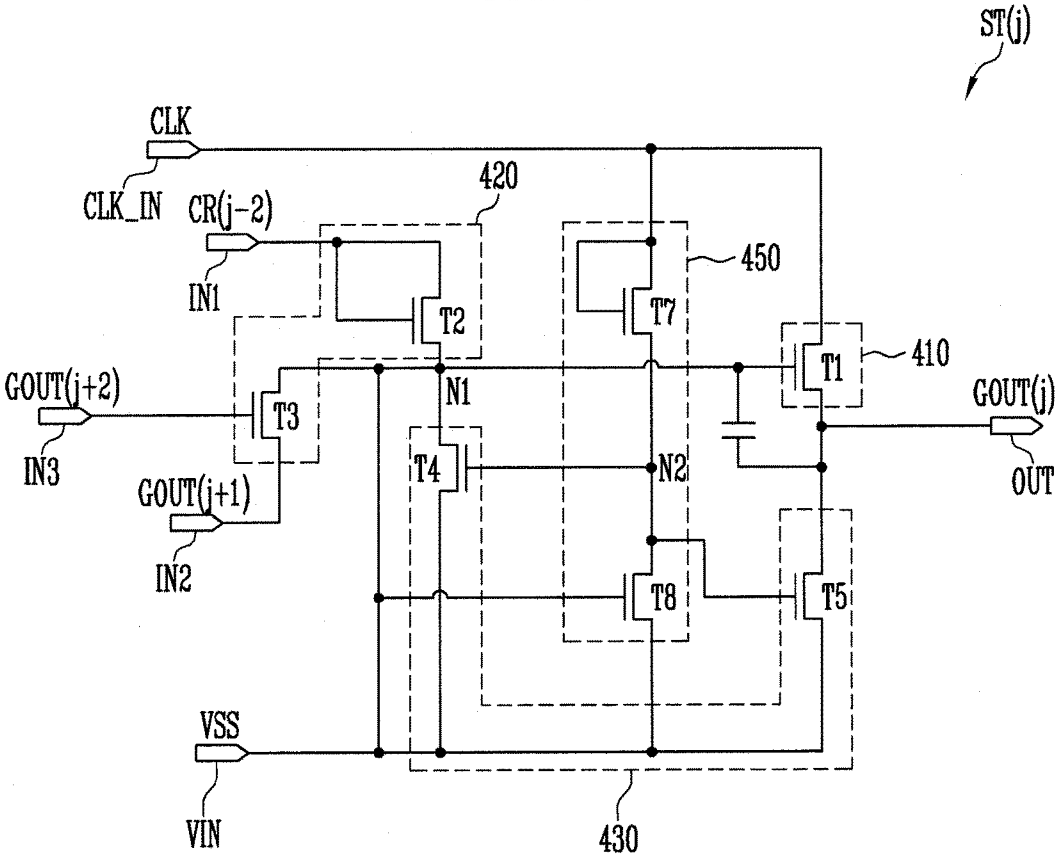
FIG. 3 is a circuit diagram of a jth stage circuit according to an embodiment of the present invention.
Figure 4:
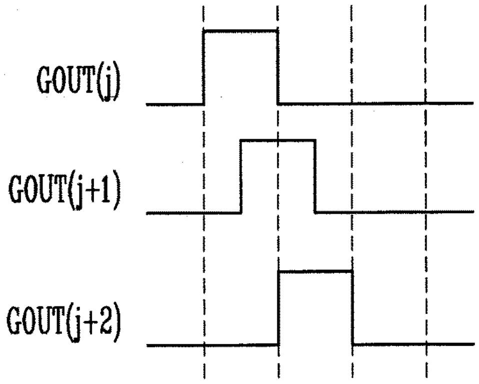
FIG. 4 is a timing diagram of gate signals output from stage circuits according to an embodiment of the present invention.
Figure 5:
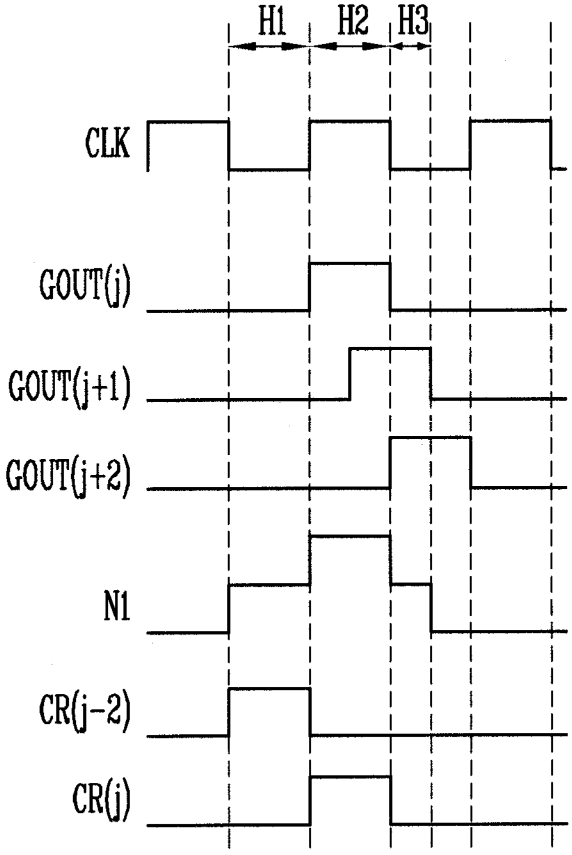
FIG. 5 is a timing diagram describing an operation of a stage circuit according to an embodiment of the present invention.

FIG. 3 is a circuit diagram of a jth stage circuit according to an embodiment of the present invention. FIG. 4 is a timing diagram of gate signals output from stage circuits according to an embodiment of the present invention. FIG. 5 is a timing diagram describing an operation of a stage circuit according to an embodiment of the present invention.

Referring to FIGS. 1, 2 and 3, the jth stage circuit ST(j) may include a buffer unit 410, an input unit 420, a holding unit 430, and an inverter unit 450.

The input unit 420 may charge the first node N1 at a level of an initial voltage in response to a first input signal CR(j−2) input to a first input terminal IN1. The buffer unit 410 may output the clock signal CLK as a gate signal to an output terminal OUT in response to the initial voltage of the first node N1.

The holding unit 430 may maintain the first node N1 at a level of the reset power source VSS in response to the clock signal CLK.

The inverter unit 450 may supply the clock signal CLK or the reset power source VSS to the holding unit 430 in response to the clock signal CLK or the reset power source VSS.

The buffer unit 410 may include a first transistor T1 having a first electrode connected to a clock signal input terminal CLK_IN, a second electrode connected to the output terminal OUT, and a gate electrode connected to the first node N1.

The input unit 420 may include a second transistor T2 having a first electrode and a gate electrode connected to the first input terminal IN1 and a second electrode connected to the first node N1 and a third transistor T3 having a first electrode connected to a second input terminal IN2, a second electrode connected to the first node N1, and a gate electrode connected to a third input terminal IN3.

The holding unit 430 may include a fourth transistor T4 having a first electrode connected to the first node N1, a second electrode connected to a reset power source terminal VIN, and a gate electrode connected to a second node N2 and a fifth transistor T5 having a first electrode connected to the output terminal OUT, a second electrode connected to the reset power source terminal VIN, and a gate electrode connected to the second node N2.

The inverter unit 450 may include a seventh transistor T7 having a first electrode and a gate electrode connected to the clock signal input terminal CLK_IN and a second electrode connected to the second node N2 and an eighth transistor T8 having a first electrode and a gate electrode connected to the reset power source terminal VIN and a second electrode connected to the second node N2.

The clock signal input terminal CLK_IN receives the clock signal CLK from the clock generator 120, the first input terminal IN1 receives the carry signal CR(j−2) from the (j−2)th stage circuit ST(j−2), the second input terminal IN2 receives the gate signal GOUT(j+1) from the (j+1)th stage circuit ST(j+1), and the third input terminal IN3 may receive the gate signal GOUT(j+2) from the (j+2)th stage circuit ST(j+2).

The reset power source terminal VIN may receive the reset power source VSS through the clock generator 120.

Referring to FIGS. 1, 2, 3, and 4, the gate on voltage periods of the gate signals output from the stage circuits of the gate driver 400 may overlap each other. A part of the gate on voltage period of the (j+1)th gate signal GOUT(j+1) may overlap the gate on voltage period of the jth gate signal GOUT(j) and a remaining part of the gate on voltage period of the (j+1)th gate signal GOUT(j+1) may overlap the gate on voltage period of the (j+2)th gate signal GOUT(j+2).

Referring to FIGS. 1, 2, 3, 4, and 5, a voltage level of the first node of the jth stage circuit ST(j) may change in accordance with the clock signal CLK, the gate signals GOUT(j+1) and GOUT(j+2) of the next stage circuits, and the carry signal CR(j−2) of the previous stage circuit.

A period in which the voltage level of the first node N1 changes may be divided into an initializing period H1, an output period H2, and a falling period H3.

In the initializing period H1, when the carry signal CR(j−2) that maintains an on voltage is input to the first input terminal IN1, the second transistor T2 charges the first node N1 by the initial voltage.

In the initializing period H1, because all the signals input to the jth stage circuit ST(j) excluding the carry signal CR(j−2) maintain off voltages, the first transistor T1, the third transistor T3, the fourth transistor T4, the fifth transistor T5, the seventh transistor T7, and the eighth transistor T8 are turned off.

In the output period H2, the clock signal CLK maintains an on voltage and the first transistor T1 supplies the clock signal CLK to the output terminal OUT in response to the initial voltage and the clock signal CLK input to the first electrode thereof.

In the falling period H3, the gate on voltage period of the gate signal GOUT(j+1) of the (j+1)th stage circuit ST(j+1) overlaps the gate on voltage period of the gate signal GOUT(j+2) of the (j+2)th stage circuit ST(j+2).

After the output period H2, when the clock signal CLK is transitioned to the off voltage, the third transistor T3 may maintain the voltage level of the first node N1 as a uniform voltage level by using the gate signals GOUT(j+1) and GOUT(j+2).

In order for the gate signal GOUT(j) output from the output terminal OUT to be transitioned to the gate off voltage without delay, the first node N1 maintains a uniform voltage. Therefore, when the gate signal GOUT(j+2) is input to the third input terminal IN3, the third transistor T3 is turned on and the gate signal GOUT(j+1) input to the second input terminal IN2 of the third transistor T3 maintains the first node N1 at a uniform voltage level.

Therefore, the jth stage circuit ST(j) may not include an additional transistor for transitioning the gate signal GOUT (j) to the off voltage.

For the sake of convenience, in FIGS. 3, 4, and 5, the configuration of the jth stage circuit ST(j) is described. However, the remaining stage circuits ST(1) to ST(n+1) of the gate driver 400 may have the same configuration.

Figure 6:
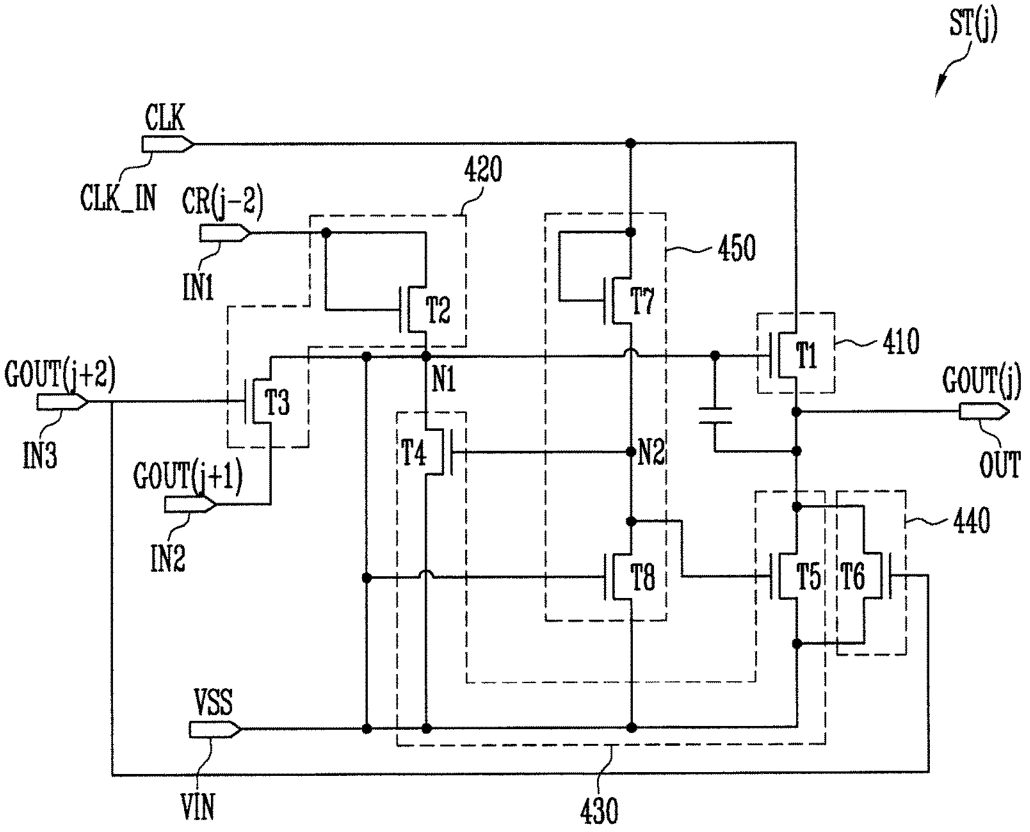
FIG. 6 is a circuit diagram of a jth stage circuit according to another embodiment of the present invention.

FIG. 6 is a circuit diagram of a jth stage circuit according to another embodiment of the present invention.

Referring to FIGS. 1, 2, 4, 5, and 6, the jth stage circuit ST(j) may include a buffer unit 410, an input unit 420, a holding unit 430, a discharging unit 440, and an inverter unit 450.

Because portions of FIG. 6 having the same configuration as the configuration illustrated in FIG. 3 perform the same operation, descriptions of these portions having the same configuration will not be repeated below.

The discharging unit 440 may discharge the output terminal OUT at the level of the reset power source VSS in response to the gate signal GOUT(j+2) of the (j+2)th stage circuit ST(j+2) input to the third input terminal IN3.

The discharging unit 440 may include a sixth transistor T6 having a first electrode connected to an output terminal, a second electrode connected to the reset power source terminal VIN, and a gate electrode connected to the third input terminal IN3.

The jth stage circuit ST(j) may transition the gate signal GOUT(j) to the off voltage by using the gate signals GOUT (j+1) and GOUT(j+2) as described in FIG. 5. In addition, the jth stage circuit ST(j) transitions the output terminal OUT by the reset power source VSS by the discharging unit 440 and may transition the gate signal GOUT(j) to the off voltage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A gate driver comprising a plurality of stage circuits configured to output a clock signal input from the outside as gate signals, wherein a jth (j is a natural number greater than 2) stage circuit of the stage circuits comprises:

an input circuit configured to charge a first node at a level of an initial voltage when a first input signal is input to a first input terminal;

a buffer circuit configured to output the clock signal as a gate signal to an output terminal when the initial voltage is supplied to the first node;

a holding circuit configured to maintain the first node at a level of a reset power source when the clock signal is supplied to the holding circuit; and an inverter circuit configured to supply the clock signal or the reset power source to the holding circuit when the clock signal or the reset power source is supplied to the inverter circuit, and wherein the input circuit is configured to maintain the first node at a voltage level of a second input signal input to a second input terminal when a third input signal is input to a third input terminal.

2. The gate driver of claim 1, wherein the input circuit comprises:

a second transistor having a first electrode and a gate electrode connected to a first input terminal and a second electrode connected to the first node; and a third transistor having a first electrode connected to the second input terminal, a second electrode connected to the first node, and a gate electrode connected to the third input terminal.

3. The gate driver of claim 1, wherein the buffer circuit comprises a first transistor having a first electrode connected to a clock signal input terminal, a second electrode connected to the output terminal, and a gate electrode connected to the first node.

4. The gate driver of claim 1, wherein the holding circuit comprises:

a fourth transistor having a first electrode connected to the first node, a second electrode connected to the reset power source, and a gate electrode connected to a second node; and a fifth transistor having a first electrode connected to the output terminal, a second electrode connected to the reset power source, and a gate electrode connected to the second node.

5. The gate driver of claim 1, wherein the jth stage circuit further comprises a discharging circuit configured to discharge the output terminal at the level of the reset power source when the discharge circuit receives the third input signal.

6. The gate driver of claim 5, wherein the discharging circuit comprises a sixth transistor having a first electrode connected to the output terminal, a second electrode connected to the reset power source, and a gate electrode connected to the third input terminal.

7. The gate driver of claim 1, wherein the inverter circuit comprises:

a seventh transistor having a first electrode and a gate electrode connected to a clock signal input terminal and a second electrode connected to a second node; and an eighth transistor having a first electrode and a gate electrode connected to the reset power source and a second electrode connected to the second node.

8. The gate driver of claim 1, wherein the second input signal is a gate signal output from a (j+1)th stage circuit, and wherein the third input signal is a gate signal output from a (j+2)th stage circuit.

9. The gate driver of claim 1, wherein a gate on voltage period of the second input signal partially overlaps a gate on voltage period of the third input signal.

10. The gate driver of claim 1, wherein the gate driver is formed in a peripheral area of a display panel having a display area and the peripheral area.

11. The gate driver of claim 10, further comprising a ninth transistor connected to a jth gate line and configured to compensate for delay of the gate signal generated by the jth gate line, the ninth transistor being provided on one side of the display panel, wherein the jth stage circuit is formed on the other side of the display panel and the output terminal is connected to the jth gate line.

12. The gate driver of claim 10, wherein the jth stage circuit is located on one side of the display panel and a (j+1)th stage circuit is located on the other side of the display panel.

13. A gate driver comprising a plurality of stage circuits configured to output a clock signal input from the outside as gate signals, wherein a jth (j is a natural number greater than 2) stage circuit of the stage circuits comprises:

an input circuit configured to charge a first node at a level of an initial voltage when a first input signal is input to a first input terminal;

a buffer circuit configured to output the clock signal as a gate signal to an output terminal when the initial voltage is supplied to the first node;

a holding circuit configured to maintain the first node at a level of a reset power source when the clock signal is supplied to the holding circuit; and an inverter circuit configured to supply the clock signal or the reset power source to the holding circuit when the clock signal or the reset power source is supplied to the inverter circuit, wherein the input circuit is configured to maintain the first node at a voltage level of a second input signal input to a second input terminal when a third input signal is input to a third input terminal, and wherein the first input signal is a carry signal output from a (j−2)th stage circuit.

14. A display device comprising:

a display panel comprising a plurality of pixels; and a gate driver comprising a plurality of stage circuits configured to output a clock signal input from the outside as gate signals, wherein a jth (j is a natural number greater than 2) stage circuit of the stage circuits comprises:

an input circuit configured to charge a first node at a level of an initial voltage when a first input signal is input to a first input terminal;

a buffer circuit configured to output the clock signal as a gate signal to an output terminal when the initial voltage is supplied to the first node;

a holding circuit configured to maintain the first node at a level of a reset power source when the clock signal is supplied to the holding circuit; and an inverter circuit configured to supply the clock signal or the reset power source to the holding circuit when the clock signal or the reset power source is supplied to the inverter circuit, and wherein the input circuit is configured to maintain the first node at a voltage level of a second input signal input to a second input terminal when a third input signal is input to a third input terminal.

15. The display device of claim 14, wherein the gate driver is configured to output the gate signals to a plurality of pixels by an interlaced method in which the gate driver is arranged on each of a first side and a second side of the display panel.

16. The display device of claim 14, wherein the input circuit comprises:

a second transistor having a first electrode and a gate electrode connected to a first input terminal and a second electrode connected to the first node; and a third transistor having a first electrode connected to the second input terminal, a second electrode connected to the first node, and a gate electrode connected to the third input terminal.

17. The display device of claim 14, wherein the buffer circuit comprises a first transistor having a first electrode connected to a clock signal input terminal, a second electrode connected to the output terminal, and a gate electrode connected to the first node.

18. The display device of claim 14, wherein the holding circuit comprises:

a fourth transistor having a first electrode connected to the first node, a second electrode connected to the reset power source, and a gate electrode connected to a second node; and a fifth transistor having a first electrode connected to the output terminal, a second electrode connected to the reset power source, and a gate electrode connected to the second node.

19. The display device of claim 14, wherein the inverter circuit comprises:

a seventh transistor having a first electrode and a gate electrode connected to a clock signal input terminal and a second electrode connected to a second node; and an eighth transistor having a first electrode and a gate electrode connected to the reset power source and a second electrode connected to the second node.

20. The display device of claim 14, wherein the second input signal is a gate signal output from a (j+1)th stage circuit, wherein the third input signal is a gate signal output from a (j+2)th stage circuit, and wherein a gate on voltage period of the second input signal partially overlaps a gate on voltage period of the third input signal.

* * * * *